United States Patent [19]

Romankiw

[11] 3,971,710

[45] July 27, 1976

[54] ANODIZED ARTICLES AND PROCESS OF PREPARING SAME

[75] Inventor: Lubomyr T. Romankiw, Briarcliff Manor, N.Y.

[73] Assignee: IBM, Armonk, N.Y.

[22] Filed: Nov. 29, 1974

[21] Appl. No.: 528,318

[52] U.S. Cl. .................................... 204/15; 204/42; 204/56 R
[51] Int. Cl.² ...................... C25D 5/02; C25D 11/00
[58] Field of Search .................. 204/15, 40, 42, 56, 204/58

[56] References Cited
UNITED STATES PATENTS

| | | | |
|---|---|---|---|
| 2,081,051 | 5/1937 | Friederich | 204/37 |
| 2,239,954 | 4/1941 | Fanselau | 148/6.3 |
| 3,303,116 | 2/1967 | Maissel et al. | 204/192 |
| 3,303,117 | 2/1967 | Flur | 204/192 |
| 3,577,275 | 5/1971 | Kosco | 357/81 |
| 3,634,203 | 1/1972 | McMahon et al. | 204/15 |
| 3,713,901 | 1/1973 | Blumenthal | 148/6.3 |
| 3,741,880 | 6/1973 | Shiba et al. | 317/101 R |
| 3,766,445 | 10/1973 | Reuter et al. | 317/235 R |
| 3,827,949 | 8/1974 | Platter et al. | 204/15 |
| 3,855,112 | 12/1974 | Tomozawa et al. | 204/15 |
| 3,862,017 | 1/1975 | Tsunemitsu et al. | 317/234 R |
| 3,864,217 | 2/1975 | Takahata et al. | 204/15 |

OTHER PUBLICATIONS

IBM Tech. Disclosure Bull., vol. 15, No. 5, Oct. 1972, pp. 1598–1599.
J. Electrochemical Soc., vol. 120, Oct. 1973, pp. 1434–1435.
The Aluminum Development Assoc. Conference on Anodizing, Sept. 12–14, (1961), Session 3, Paper 6, By J. F. Murphy et al.
Anodic Oxide Films on Aluminum, by J. W. Diggle et al., Rutherford College of Tech., England 1968.

*Primary Examiner*—T. M. Tufariello
*Attorney, Agent, or Firm*—Pollock, Vande Sande & Priddy

[57] ABSTRACT

An anodizing process includes depositing a first conductive layer on a dielectric layer; depositing a porous metal oxide-forming layer on the first conductive layer; anodizing the porous metal oxide-forming layer to provide porous anodized material; treating the first conductive layer to render it non-conductive. The process and articles fabricated thereby are especially suitable for use in multilevel metallurgical structures, and in electronic structures in which it is designed to have planar conductors.

46 Claims, 6 Drawing Figures

ANODIZED ARTICLES AND PROCESS OF PREPARING SAME

BACKGROUND OF THE INVENTION

The present invention is directed to an anodization process and to the anodized articles formed thereby. In particular, the present invention is concerned with a process for anodizing an article containing a porous oxide-forming metallic layer which is supported by a substrate containing a dielectric.

Articles containing anodized metals, such a anodized porous aluminum oxides on dielectrics, have been prepared and have been suggested for application in metallurgical integrated structures such as magnetic recording heads and in gas or plasma display panels. However, these articles have not been entirely satisfactory and have been difficult to prepare. For instance, it has been difficult to fully anodize all portions of the metal which are to be anodized since a metal member normally anodizes more rapidly at its edges, whereby the internal metallic regions of said member tend to become electrically isolated due to the formation of surrounding, insulating areas of anodized porous metallic material. Once these large internal regions and/or small individual gain regions become electrically isolated from the action of the electrolytic solution due to the action described, it is no longer possible to pass current to the still remaining unanodized metallic regions. Accordingly, the article may contain unwanted, unanodized, interior metal regions, which detract from the usefulness of the article for its intended purpose.

In particular, the presence of nonanodized metallic residue reduces the transparency of an article thereby decreasing its value for use in gas or plasma display panels. Also the presence of nonanodized metallic residue reduces the effectiveness of the anodized porous material as an electrical insulation medium. Due to the presence of the unanodized metal residue, the anodized aluminum retains the ability to act as a partial electrical conductor in a device such as metallurgical structure, which in turn may cause improper circuit connection and/or shorting of the circuit, and/or small current leakage.

Accordingly, the objects of the present invention are to provide an improved method for forming anodized porous layers which at least reduces, If not completely eliminates, the presence of unanodized metal residue in internal regions of the anodized porous layer. It is a further object of the present invention to provide a process for selectively anodizing a porous oxide-forming metallic layer which is relatively inexpensive and easy to carry out successfully.

SUMMARY OF THE INVENTION

The problems discussed above are obviated, in accordance with the present invention, by providing an electrically conductive layer between a dielectric layer and a porous metal oxide-forming layer on said dielectric which conductive layer continues to provide a path for current flow during anodization of the oxide-forming layer beyond the operating point where, in the absence of the conductive layer, current flow might cease, thereby to permit more complete anodization of the oxide-forming layer and the rejection or elimination of the aforementioned unwanted metal residue therefrom, whereafter the conductive layer is itself converted to nonconductive form.

More particularly, the present invention is concerned with a process for forming anodized porous material containing articles which comprises:

A. depositing an electrically conductive layer on a dielectric layer;
B. depositing a porous metal oxide-forming layer on the electrically conductive layer, the porous metal oxide-forming layer being thicker than the electrically conductive layer;
C. anodizing at least a portion of the porous metal oxide-forming layer through the complete thickness of the layer to provide a layer containing anodized porous material;
D. the electrically conductive layer deposited in step (A) constituting a material different from material deposited in step (B), and the conditions of anodization being such that the material deposited in step (A) acts as a valve metal during the anodizing of the porous metal oxide-forming layer and requires a higher potential for its anodization than is required for anodization of the porous metal oxide-forming metallic layer; and then
E. treating the electrically conductive layer to render it non-conductive.

The present invention is also directed to forming a multilevel metallurgical intergrated structure which comprises:

A. depositing an electrically conductive layer on a dielectric layer;
B. depositing a porous metal oxide-forming layer on the electrically conductive layer, wherein the porous metal oxide-forming layer is thicker than the electrically conductive layer;
C. anodizing only a portion of the porous metal oxide-forming layer to provide a layer containing anodized porous material while protecting from anodization preselected portions of the porous metal oxide-forming layer which are to form desired electrical connections;
D. the electrically conductive layer deposited in step (A) constituting a material different from the material deposited in step (B), and the conditions of anodization being such that the material deposited in step (A) acts as a valve metal during the anodizing of the porous metal oxide-forming layer and requires a higher potential for its anodization than is required for anodization of the porous metal oxide-forming metallic layer;
E. then treating the electrically conductive layer to render it nonconductive;
F. depositing a dielectric layer on the layer containing the anodized porous material and the desired electrical connections; and
G. then repeating steps (A) to (E).

The present invention is also concerned with articles and multilevel metallurgical integrated structures prepared according to the processes described above.

The present invention is further concerned with an anodized porous material containing article which comprises:

A. a dielectric layer;
B. an anodized porous material-containing layer on said substrate;
C. a nonelectrically conductive layer obtained from a conductive layer interposed between the anodized porous metal oxide-containing layer and the dielectric; and D. the anodized porous material-containing layer being thicker than the nonelectrically conductive layer and being different material than the nonelectrically conductive layer.

Moreover, the present invention is concerned with a multilevel metallurgical integrated structure which comprises:

A. a first dielectric layer;
B. a first anodized porous material-containing layer on the dielectric;
C. a first nonelectrically conductive layer obtained from an electrically conductive layer interposed between the anodized porous material-containing layer and the dielectric;
D. the anodized porous material-containing layer being thicker than the oxidized nonelectrically conductive layer and being different material than the nonelectrically conductive layer;
E. the anodized porous material-containing layer also including unanodized metal portions which form predetermined electrical connections;
F. elements (A)-(E) cooperating with one another to form one level of the multilevel metallurgical integrated structure; and
G. at least one further level containing the same arrangement of elements described in (A)-(E), with the dielectric layer of the further level being superimposed on the anodized porous material-containing layer of the one level.

DESCRIPTION OF PREFERRED EMBODIMENTS

The dielectric layer referred to earlier, and employed in the present invention, can be any dielectric material. Usually the maximum conductivity of the dielectric is no greater than about 10 mhos/cm.

Some examples of dielectric materials include glass, silicon dioxide, germanium oxide, and the nonelectrically conductive oxides of metals such as titanium and tantalum.

The thickness of the dielectric can, of course, vary greatly depending on the particular application of the product.

In addition, in some instances it may be desirable to deposit the dielectric material on top of a semiconductive substrate. Usually the maximum conductivity of such semiconductive substrate is no greater than about 100 mhos/cm.

Illustrative of the semiconductive materials are germanium, silicon, silicon carbide, selenium, and III-V compounds such as GaAs. Examples of other semiconductive materials include dielectric materials which have been doped with such substances as boron, aluminum, gallium, indium, phosphorous, arsenic, and antimony.

The thickness of the dielectric can vary greatly depending upon the particular application of the product. The dielectric can be deposited upon the semiconductive material by any of the known means of coating including sputtering, vacuum evaporation coating, chemical vapor decomposition and the like.

Figure 4:
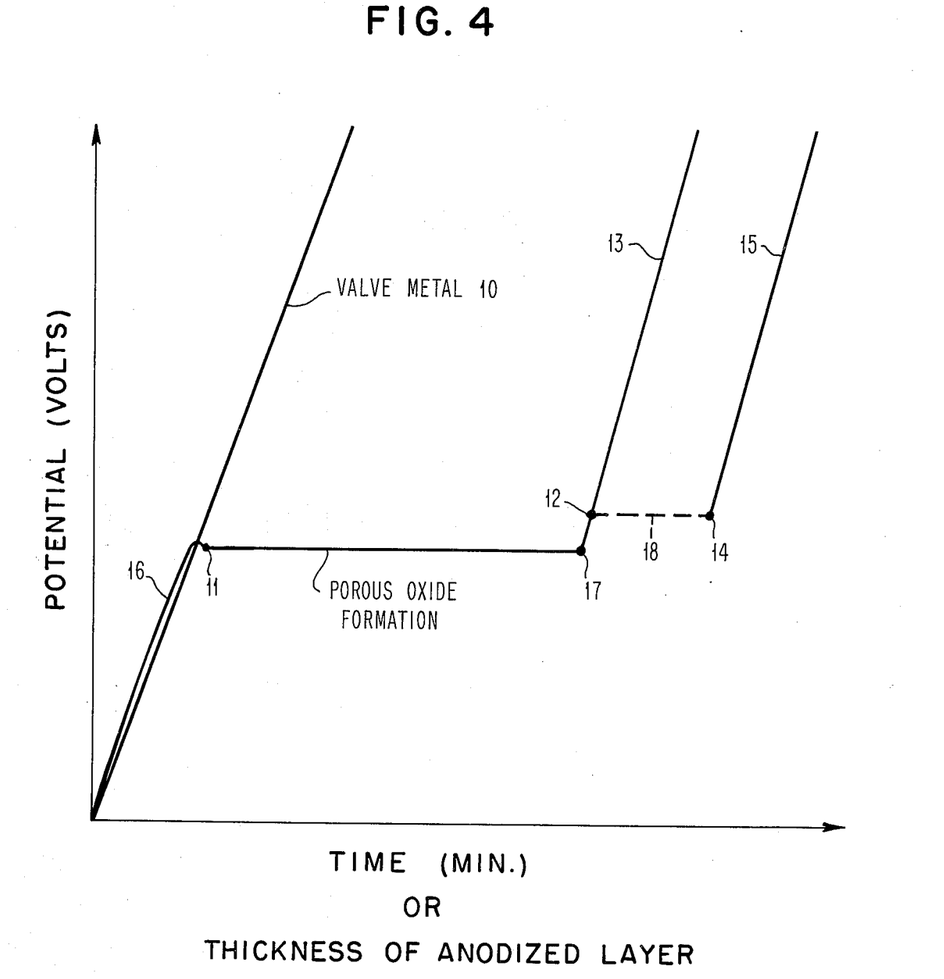
FIG. 4 is a graph illustrating the behavior of the porous metal oxide-forming material and "valve metal" during anodization.

The electrically conductive layer referred to earlier is composed of a material which has higher electrical conductivity than the particular dielectric with which the conductive layer is employed. It may be composed of a metal, mixture of metals, or a metal alloy. The electrically conductive layer is chosen so that it acts as a valve metal during the anodization of the porous metal oxide-forming layer. The term "valve metal" as used in the prior art and hereinafter refers to material which will anodize only to a specific thickness which is primarily dependent upon the magnitude of the potential applied to the material, and upon the specific material employed. Once the layer is anodized to that specific thickness, no more current can be passed through the material without increasing the potential if the other anodization conditions, such as temperature and composition of solution, are maintained. Accordingly no further anodization takes place. In order to further anoidize a valve metal while maintaining constant such conditions as temperature and anodizing composition, it is necessary to increase the applied potential. Curve 10 in FIG. 4 illustrates the direct relationship of the anodization of valve metals to applied potential.

The electrically conductive layer must possess a higher potential or voltage requirement for anodization than the anodizable porous metal oxide-forming layer for the anodizing conditions employed, such as the anodizing solution and temperature. Generally the voltage requirement for anodization of the electrically conductive layer is not more than about ten times and preferably not more than about five times as much as is required for anodization of the porous metal oxide layer under the anodization conditions employed.

The electrically conductive layer should be thick enough so that it is not completely anodized during the anodization of the porous metal oxide-forming layer, but should not be so thick that subsequent further treatment of that conductive layer to render it non-conductive would require application of impractical potentials or would adversely affect the final product to an undesired extent. The electrically conductive layer is, of course, thinner than the anodizable porous metal oxide-forming layer. It has been found convenient to employ electrically conductive layers of a thickness such that the layer could be completely anodized at room temperature in the anodizing solution employed for the porous metal oxide layer using a potential of about 5 to 150 volts above the anodizing potential required for the porous metal anodization at room temperature. Of course, the conductive layer employed should not delaminate from the substrate when treated to become non-conductive and preferably should not evolve gases such as oxygen or hydrogen which in the form of bubbles may tend to disrupt or fracture the surface when treated. Furthermore, the conductive layer should not be soluble or at most be only slightly soluble in the electrolytic solution employed for anodizing the porous metal oxide-forming layer.

The preferred materials of the conductive layer include Group IIA metal such as magnesium; Group IVA materials such as tin, amorphous silicon, and polycrystalline silicon; Group IVB substances such as titanium, zirconium and hafnium; Group VB metals such as vanadium, niobium, and tantalum; and Group VIB metals such as tungsten, chromium, and molybdenum. The most preferred materials employed according to the present invention are niobium, tantalum, and hafnium. Of course, alloys and mixtures of the above materials may be employed when desired.

The conductive material can be deposited upon the dielectric by any of the known means of coating such as sputtering, vacuum evaporation coating, chemical vapor decomposition and the like.

The material deposited on top of the electrically conductive layer must be an anodizable porous metal oxide-forming material, and differs from the particular material of the electrically conductive layer with which it is employed. Such anodizable materials include aluminum, aluminum alloys, mixtures of aluminum and other metals, magnesium, magnesium alloys, and mixtures of magnesium and other metals. The preferred anodizable porous metal oxide-forming material contains aluminum.

Some aluminum alloys, of the types referred to above, include aluminum-manganese, aluminum-silicon, aluminum-magnesium, aluminum-lead, aluminum-bismuth, aluminum-nickel, aluminum-chromium, aluminum-zinc, aluminum-tin, and aluminum-copper alloys. The amount of alloying material in the aluminum alloy can vary considerably depending upon the specific alloying material employed so long as the alloying materials in the amounts employed will not act to destroy the porous and the dielectric properties of the layer. Such amounts are readily ascertainable by those skilled in the art. For instance, aluminum-copper and aluminum-magnesium alloys should preferably contain no more than about 10% by weight of copper and/or magnesium but other alloys may contain substantially greater amounts of other materials alloyed with aluminum. The aluminum alloys employed in this invention usually contain at least about 80% by weight of aluminum and preferably at least about 95% by weight of aluminum. Likewise, mixtures of aluminum and another material can vary considerably depending upon the specific material so long as the material and the amounts used will not act to destroy the desired porous and dielectric characteristics of the layer. The mixtures employed generally contain at least about 80% by weight of aluminum and preferably at least about 95% by weight of aluminum.

The porous metal oxide-forming layer is thicker than the electrically conductive layer and is generally several times as thick. it is advantageous to employ a porous metal oxide-forming layer which is at least about 5 times as thick as the electrically conductive layer. Preferably the porous metal oxide-forming layer is at least about ten times as thick and most preferably is between about 50 and 250 times as thick as the electrically conductive layer. Of course, the specific thickness will depend upon the particular intended use of the completed article. In addition, when forming line patterns such as connectors in metallurgical structures, it is recommended that the thickness not exceed the minimum width of the narrowest line of the pattern to be electrically isolated. Thicker layers could result in undercutting of the patterns to an undersirable degree for incomplete electrical isolation of the lines. Preferably the thickness is no more than about one half the minimum width between any two lines of the pattern to be electrically isolated.

The porous metal oxide-forming layer can be deposited upon the electrically conductive layer by any convenient or suitable means of forming such a layer on a substrate, such as by sputtering, vacuum evaporation, or chemical vapor decomposition or electrodeposition.

The porous metal oxide-forming layer can be anodized in any anodizing solution which acts on the layer in a known manner to form anodized porous material. Solutions which form anodized porous metal oxide are well known in the art and include solutions of sulfuric acid, phosphoric acid, chromic acid, and oxalic acid. Generally almost any concentration of acid can be employed to form a porous type metal oxide-containing layer. The preferred anodizing solutions include oxalic acid solutions containing about 2 to about 18% oxalic acid; sulfuric acid solutions containing about 5 to about 30% sulfuric acid; phosphoric acid solutions containing from about 1 to about 40% phosphoric acid and chromic acid solutions containing from about 1 to about 10% chromic acid.

In the process of the present invention, it is preferable to carry out the anodization of the porous metal oxide-forming layer by initially employing a constant current anodization. The particular current value will of course depend upon the thickness of the layer and/or upon the desired time to complete the first stage of the anodizing and/or upon the specific material of the layer and/or upon the anodizing temperature.

For instance, for aluminum containing layers it has been found convenient to employ about 1 to about 20 milliamps/cm$^2$ of surface area of aluminum containing layer. Also, depending upon the thickness of the aluminum layer, this stage of the anodization is usually completed within about 60 minutes and most often in about 10 to about 30 minutes.

FIG. 4 illustrates what occurs during the first stage of anodization of a porous metal oxide-forming material of uniform composition throughout the thickness of the layer and exemplifies why it is convenient to use constant current rather than constant potential. The porous metal oxide-forming material is anodized by constant current with a concomitant increase 16 in the potential up to a point 11 (in FIG. 4) at which time the anodization proceeds without any further increase in potential at constant temperature. The potential then remains fairly constant while the anodizing solution works its way through the porous metal oxide-forming material, thereby to provide anodized porous material (see the region 11 to 17 in FIG. 4). In the absence of the present invention, this process would continue until current could no longer flow; and, due to the effects described previously a portion only of the oxide-forming material might then be anodized with that portion insulating other portions of the material to prevent anodization thereof, i.e., the prior anodization process could well result in the formation of metal residues or islands in the interior of the anodized material which would be isolated from anodization. Stated another way, without the presence of the conductive underlayer, which is employed in the present invention, sufficient current could not be passed through the porous oxide layer to effect complete anodization thereof. Without the conductive underlay, the resistance of the oxide-forming layer would effectively increase beyond operating point 17 (FIG. 4) and the applied constant current would rapidly increase the potential needed for further anodization of the isolated metal regions (see curve portion 13 in FIG. 4).

In the practice of the present invention, as the anodization proceeds to a point, i.e., that generally represented by point 12 in FIG. 4, it is preferable to switch from a constant current control to a constant potential control. This potential is somewhat greater than that necessary to anodize the metal islands remaining in the anodized porous layer, but not sufficient to completely anodize the electrically conductive layer. The value of the constant potential can therefore be selected to limit the degree of anodization of the conductive layer. The electrically conductive layer and anodization conditions are selected so that the layer acts as a valve metal during this anodization and will anodize to only a certain thickness depending on the applied potential and upon the specific material of the conductive layer.

Figure 1:
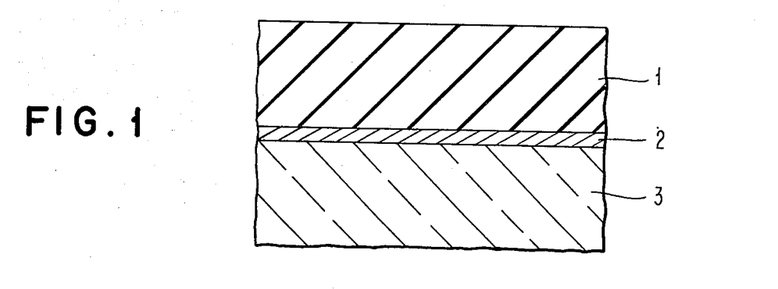
FIG. 1 is a cross sectional view of an anodized article prepared according to the present invention.
Figure 2:
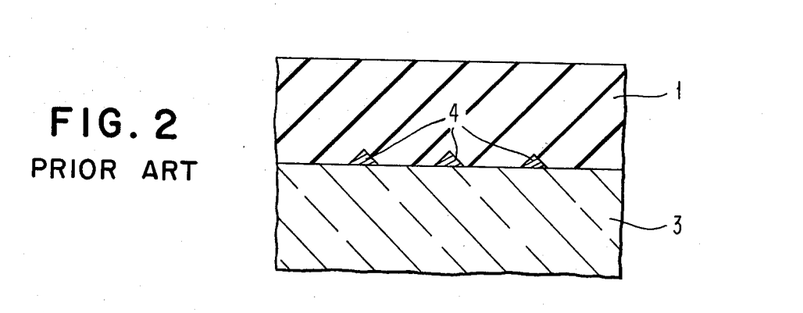
FIG. 2 is a cross sectional view of an anodized article prepared according to prior techniques.

As illustrated in FIG. 1, the presence of the electrically conductive layer 2, between oxide-forming layer 1 and substrate 3, provides increased electrical contact to the metal residues which otherwise might become isolated due to the uneven anodization occurring in the formation of the anodized porous material in layer 1. As illustrated in FIG. 2, the present invention greatly reduces the undesirable metal residue 4 present in the anodized layer 1, and makes it possible to improve the light transparency of the article and/or to decrease the possibility of short circuiting or faulty circuit connections in articles which contains patterns of closely aligned conductors separated by the anodized porous material. The present invention thus makes it possible to provide a much more effective anodized insulation, such as an aluminum oxide insulation.

After the anodization of the porous metal oxide-forming material is completed, the electrically conductive layer 2 can then itself be rendered non-conductive. It is understood, of course, that the term "non-conductive" as as used herein includes the conducting of electricity up to a very small degree, such as when the bulk of the underlayer is rendered nonconductive with small amounts of untreated metal residue hydroxides or hydrated oxides remaining. Exemplary of some chemical reactions suitable for rendering the conductive layer nonconductive include oxidizing, nitriding, carbiding, sulfidizing, and the like, such as by a reaction in the presence of a substance which can readily give up oxygen or any other anion transforming the underlayer to a nonconductor. Oxidation is the preferred treatment for rendering the conductive layer nonconductive. The conductive layer can be oxidized employing any oxidation process or combination of oxidation processes which does not adversely affect the anodized aluminum oxide-containing layer to an undesirable degree. One such method includes anodization using a higher anodizing potential than was used for the porous metal oxide-forming material. Other oxidation processes suitable for the present invention include anodization using a different anodizing solution than was used for the porous metal oxide-forming material; oxidation at elevated temperature in oxygen-containing atmosphere such as air, oxygen or oxygen plasma; and/or oxidation due to the presence of a substance which can readily give up oxygen at elevated temperatures. Combinations of the above oxidation processes can be employed, when desired.

One facile manner in which the electrically conductive underlayer can be oxidized is to use the same anodizing solution as was used for the porous metal oxide-forming material and merely change from a constant potential anodization to a constant current anodization. The current is selected so that it is high enough to completely anodize the entire thickness of the electrically conductive underlayer. The constant current must be set to some value greater than the current observed when anodizing porous metal oxide-forming layer at constant potential. It has been found convenient to use currents from about 0.5 to about 20 milliamps/cm$^2$ of surface area of the underlayer. This oxidation is generally completed in about 5 to about 45 minutes, depending upon the current used, the anodization rate of the specific material and upon the thickness of the conductive layer.

After the electrically-conductive layer is anodized, it is desirable to heat the article to temperatures sufficient to cause release of any water which may be present in the anozided layers as free water, water of hydration, or metal hydroxides. The released water can further react with any nonoxidized metal which might be present to further oxidize, thereby improving the transparency and increasing the resistance of the layers. It is generally advantageous to carry out the above heating at temperatures of about 300° to 400°C in air for several hours such as about 2 to 10 hours.

Although the electrically conductive layer might, after being treated such as by oxidation, contain some residual unmodified conductive material, the amount and size of the residual material will be small due to the relative thickness of the underlayer. Accordingly, any untreated (i.e., unoxidized) metal which might remain will not have an appreciable effect upon the transparency of the article and/or upon its electrical insulating properties.

In addition, it is further noted that if there is any problem in adhering the conductive layer to the dielectric or semiconductive substrate it may be desirable to include a further layer between the conductive layer and the substrate to enhance adhesion therebetween. For instance, when employing a dielectric or semiconductive substrate which is an oxide such as silicon dioxide, any adhesion problems could be readily overcome by merely including an oxide of the electrically conductive material between the conductive layer and the substrate.

The process of the present invention finds particular advantage in those applications wherein anodized metals on dielectrics have previously been suggested for use, such as in gas or plasma display panels, magnetic recording heads and other multilevel metallurgical integrated structures.

For instance, in the gas or plasma display panels, flat plates of glass are arranged in a parallel spaced relationship to each other and contain conductors. The conductors may cross each other at different points, being separated by anodized porous metal oxide insulation. Since the conductors are close to each other, the removal of residual conductive metal residue prevents possible shorting at those places in which the conductors cross or are in close proximity. The removal of the residual metal also can improve the transparency of the gas panels. With respect to magnetic heads, again the anodized porous metal oxide non-conductive insulating layer prepared according to the present invention forms a much better insulator between the conductive coils thereby preventing against short circuiting.

The metallugrical structures are prepared by following the above-described process steps in combination with some additional steps. In particular, the preparation of multi-level metallurgical structures involves depositing an electrically conductive layer on a dielectric layer, and then depositing an anodizable porous metal oxide-forming layer on top of the conductive layer as previously discussed. Then, only a portion of the porous metal oxide-forming layer is anodized while those portions of the porous metal oxide-forming layer which are to form desired electrical connections are protected or masked from anodization. Appropriate methods of masking are well known in the art and need not be described in great detail in this application.

Of particular importance are methods which involve coating those selected portions of the porous oxide-forming layer portions, which are to act as electrical connectors with a photoresist polymer composition. Commercially available photoresist products are obtainable from Shipley Company, Inc., of Wellesley, Mass. and Eastman Kodak Company of Rochester, N.Y. One particular commercially available material is Shipley Resist-1350 which according to the manufacturer is a metacresol formaldehyde novalak resin sensitized with 2-diazo-L-oxyl-naphthalene-5-sulfonic acid ester of 2,3,4-trihydroxybenzophenone. Such polymer compositions are not affected by the anodization process but at some later time can be removed or destroyed by use of ultraviolet light, electron beam, and/or X-ray. These, however, will not adversely affect the previously formed metallic compounds.

Moreover, it has been observed that some adhesion problems sometimes occur between the porous oxide-forming layer and particularly an aluminum-containing layer and masking polymers of the above type. Such adhesion problems can be obviated by preoxidizing the porous oxide-forming layer to a thickness of approximately the buildup of barrier layer of oxide and just at about the beginning of the formation of porous oxide, and thereafter applying the polymer masking composition. This preoxidation improves the adhesion between the masking composition and porous metal oxide-forming layer while not significantly destroying the conductive properties of the porous metal oxide-forming layer. A particular advantageous procedure is to preoxidize the porous metal oxide-forming layer to a depth of about 500° to 1200° A, and then to expose the preoxidized layer to 1% oxygen in $CF_4$ plasma at about 50 watt power input at room temperature for about 5 minutes. After this the article is baked at about 150° C for about 1 hour in air. Next a masking polymer photoresist or electron sensitive resist composition of the types mentioned above is applied to the porous metal oxide-forming layer by conventional coating techniques such as spraying, dipping, spinning, and the like. The article is then baked at about 75° C for about ½ hour. After this, the article is exposed to the desired pattern and developed by conventional techniques including ultraviolet light and/or electron beam or x-ray beam techniques. Next, the article is baked at about 110° C for about 20 minutes and is then exposed to 1% oxygen in $CF_4$ plasma at about 50 watt power input at room temperature for about 5 minutes to remove organic residue after development. Then the anodization is carried out as previously discussed herein.

Furthermore, the adhesion between the porous oxide-forming layer and masking polymer composition can be enhanced by providing a layer of a nonconductive material such as $SiO_2$ between the porous metal oxide-forming layer and masking polymer. Those portions of the nonconductive layer are etched away wherein it is desired to form the porous metal oxide insulation.

In addition, the masking can be achieved by using a solution which forms a barrier nonporous metal oxide layer, such as a nonporous aluminum oxide layer, and then etching away the metal oxide nonporous layer in those portions wherein it is desired to form the porous metal oxide insulation. After the anodization of the porous metal oxide-forming layer and the oxidation of the conductive underlayer, the barrier layer of nonporous metal oxide can be removed by etching if desired to make an electrical contact with a subsequent conductor.

A particular advantageous solution used to form nonporous aluminum oxide barrier layers is ammonium pentaborate solution. The concentration of ammonium pertaborate is generally from about 10 to about 40% by weight and preferably from about 25 to about 35% by weight. During the subsequent anodization of the remaining aluminum, the masked or coated aluminum is not anodized because of insulating properties of the barrier layer of the aluminum oxide.

Of course, other methods of masking can be employed, if desired.

After the preselected portion of the porous metal oxide-forming layer is anodized, the electrically conductive underlayer is treated according to the procedure previously discussed herein. Thereafter, the masking material is removed or destroyed when desired by any conventional technique.

Next a further dielectric layer is deposited upon the surface containing the anodized porous metal oxide and the desired metal electrical connections. The dielectric material can be any of the materials previously suggested for use as the earlier described substrate. The further dielectric layer can be deposited by any convenient technique, e.g., sputtering.

A further electrically conductive layer is then deposited on the further dielectric layer. The electrically conductive layer can be any of the conductive materials previously discussed for use in such a layer, and can be deposited by any of the techniques previously discussed. After this, a still further porous metal oxide-forming material is deposited upon the further conductive layer. This further porous metal oxide-forming material can be deposited employing the same types of process suggested for depositing the initial porous metal oxide-forming material. The particular parameters of thickness discussed above for the initial porous metal oxide-forming layer also apply to this subsequent porous metal oxide-forming layer.

Next, only a portion of the porous metal oxide-forming layer is anodized while a preselected portion is protected from anodization. This preselected portion of the layer is to form desired electrical connections. The portions can be protected from anodization by masking means as previously discussed. The further electrically conductive layer is then treated according to any of the methods discussed above.

Figure 3:
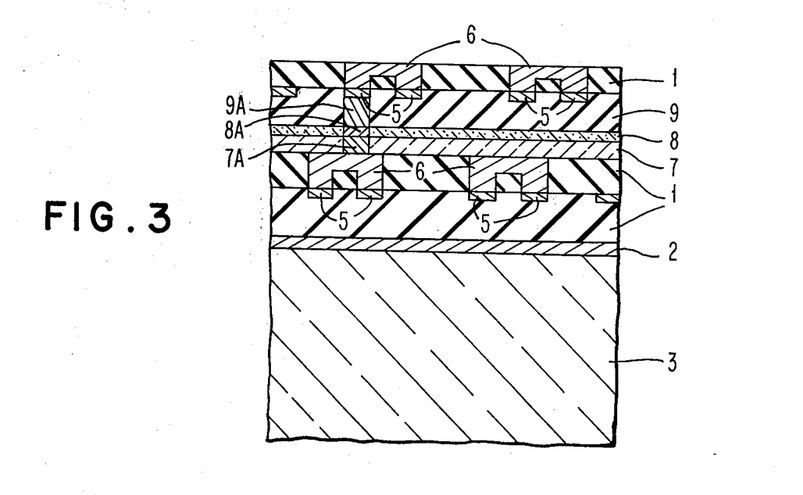
FIG. 3 is a cross sectional view of metallurgical structure prepared by the present invention.

The electrical connection between the two layers 1 and 1 in FIG. 3 can be obtained by providing masking on that portion of the article represented by numeral 7A in FIG. 3 prior to depositing the further dielectric layer and then depositing the further dielectric layer. Next the masking is removed and then masking is provided on the layer except for the portion represented by numeral 7A. Then an electrically conductive material is deposited after which the masking is removed whereby a layer containing the dielectric material and electrically conductive material 7A is obtained. Likewise, electrical portions 8A and 9A can be provided by repeating the above described sequence of steps whereby the further conductive underlayer is deposited in layer 8 and the further metal oxide-forming material is deposited in layer 9.

This above-discussed group of steps can be repeated as many times as desired, to form as many levels as desired in a multilevel structure. One particular advantage of using described anodization process in forming multilevel metallurgical integrated structures is that the thickness of the anodized porous metal material insulating layer can be selected to provide an article which is substantially planar as compared to various other multilevel integrated structures. Accordingly, building of plural levels is facilitated and connections between two different levels is facilitated due to the substantial planarity of the article.

Since the anodized porous metal compound will be somewhat thicker than the unanodized material due to the anodization to porous compound, it is advantageous to reduce the thickness of the anodized porous portion so that it corresponds to the thickness of the unanodized portion by raising the temperature of the anodization solution. This raising of the temperature will result in dissolving a portion of the surface of the porous metal compound, thereby reducing its height or thickness so that it is possible to render the insulating porous metal compound more level with the unanodized metal portion. Raising the temperature to about 35° to 40° C has been found effective in various instances. However, depending upon the difference in the volume of the anodized metal and the volume of the unanodized metal, different temperatures may be necessary or desired.

Moreover, it is possible using a constant temperature to reduce the thickness of the anodized porous metal compound so that it corresponds to the thickness of the unanodized portion by reducing anodization current density and thereby increasing the time required to anodize the porous metal oxide-forming layer and/or retaining the article in the anodization bath for an extended time past the completion of the anodization.

FIG. 1 is a diagrammatical cross sectional view of an anodized porous-containing article prepared according to the present invention. In FIG. 1, 1 illustrates the anodized metal oxide-containing layer, and 2 illustrates the conductive layer or nonconductive form thereof at a later stage in the process. 3 illustrates the dielectric substrate.

In FIG. 2, 1 and 3 represent the anodized porous metal oxide, and the dielectric substrate, respectively. 4 represents electrically isolated unanodized metal residue.

FIG. 3 is a cross sectional diagrammatic view of a multilevel metallurgical integrated structure. 1, 2 and 3 are the same as the corresponding elements in FIG. 1. 5 represents existing operative elements of the circuitry to which the electrical contact is being made. 6 represents the unanodized metal which forms desired electrical connections between different elements 5 of the structure. 7 represents the further dielectric layer in the next level; 8 represents further nonconductive (i.e., oxidized) underlayer; and 9 represents the further anodized porous metal oxide-containing layer. FIG. 3 illustrates that both layers 1 and 1 are electrically connected by 7A, 8A and 9A to provide a conductor network.

FIG. 4 is a graph illustrating the behaviors of the porous metal oxide-forming material and the material which acts as a valve metal during the anodization. Curve 10 illustrates the direct relationship between the anodization time and/or thickness of the anodized layer of a valve metal, and the potential applied. Curve 16 illustrates the direct dependence of the anodization of the porous metal oxide-forming material upon increases in potential up to a point 11. The foregoing region, between points 11 and 17, illustrates that portion of the anodization wherein the porous metal oxide-forming layer is being converted into a porous oxide while the potential remains constant. Up until point 12, as discussed previously, it is preferred that the anodization be conducted under constant current conditions. At about point 17, the potential begins to rise and, as illustrated by line 13, in the absence of the conductive layer the unanodized residual electrically isolated metal would not be anodized as the resistance of the aluminum oxide layer approaches infinity relative thereto. Line 18, which connects points 12 and 14, illustrates the anodization of the residual metal which is made possible by the presence of the conductive underlayer. This portion of the anodization is conducted by using a constant potential. Line 15 which begins at point 14 illustrates the further anodization of the conductive layer. This further anodization is conveniently carried out by employing a constant current.

Figure 5:
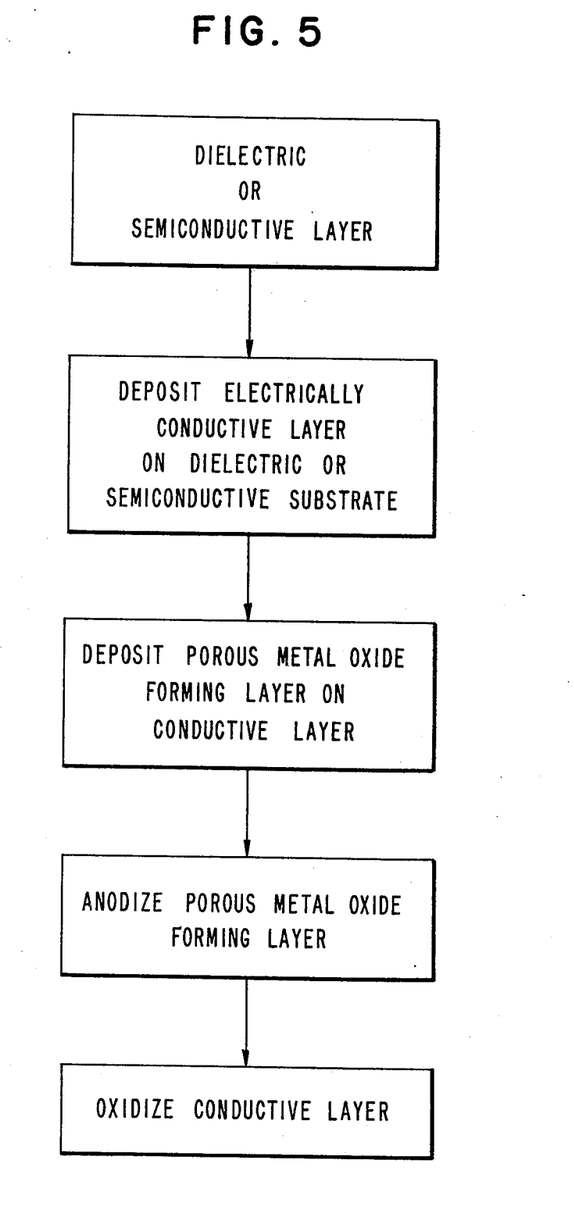
FIG. 5 is a block diagram illustrating the process of the present invention.

FIG. 5 is a block diagram illustrating the process of the present invention.

Figure 6:
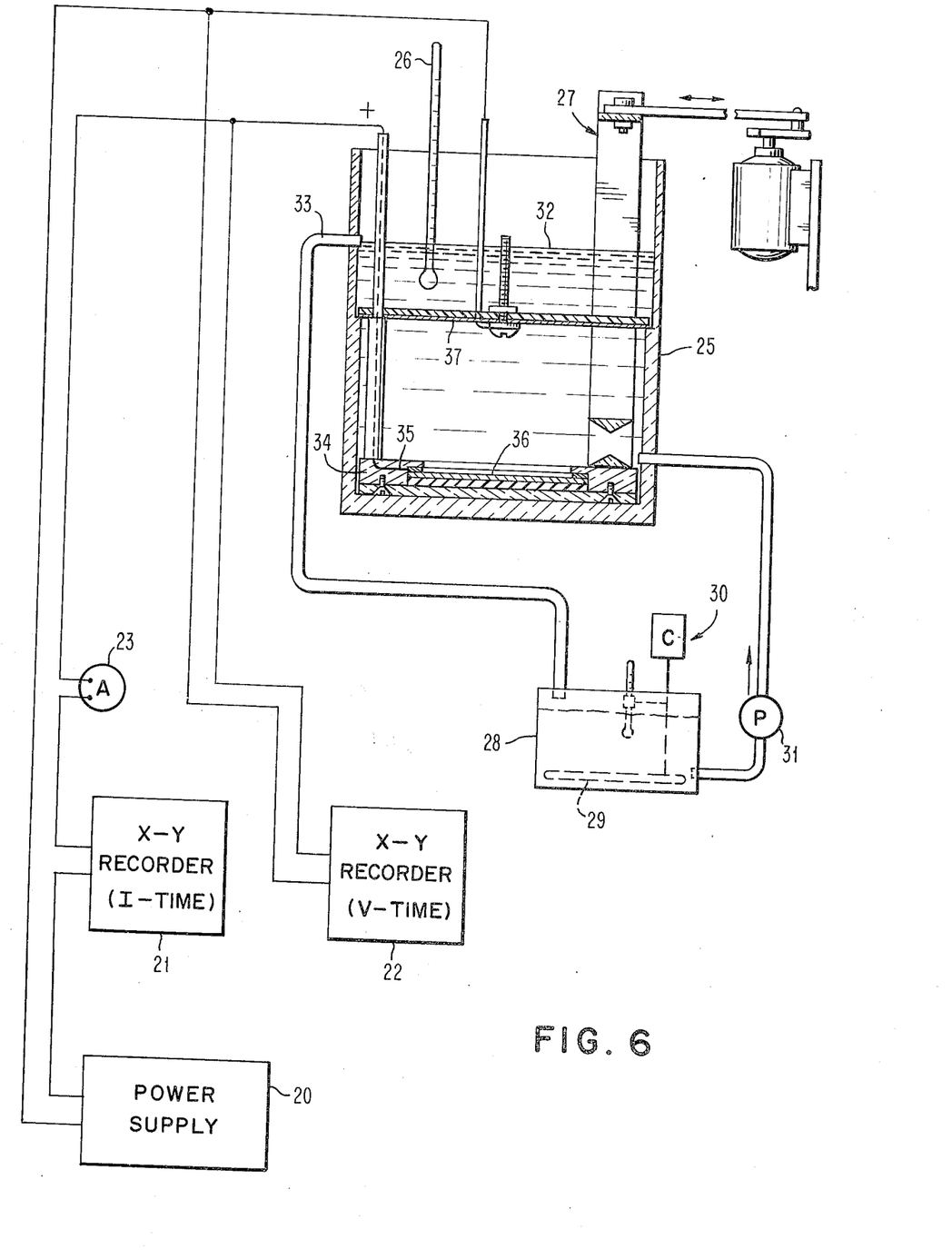
FIG. 6 illustrates apparatus which can be employed in carrying out the present invention.

FIG. 6 illustrates apparatus which can be employed in carrying out the present invention. The apparatus includes a regulated power supply 20 capable of operation either under constant current or constant potential condition, X-Y recorder 21 used to monitor the current across the cell as a function of time of anodization, X-Y recorder 22 used to monitor the voltage across the cell as a function of time of anodization, ammeter 23, a plating cell 25 equipped with a thermometer 26, a stirring mechanism 27 which in turn is connected to a motor; a constant temperature solution reservoir 28 equipped with a quartz heater 29, a temperature controller 30, and a positive displacement recirculation pump 31. A particular temperature controller is commercially available under the trade designation "Therm-O-Watch" from Instrument for Research and Industry, Cheltenham, Pennsylvania. If desired, the X-Y recorders may be substituted by one current time and one voltage time recorders.

The cell is equipped with a stirring paddle 27 which in turn is connected to a motor to permit carrying out the anodization under either agitated or nonagitated conditions. The temperature of the electrolyte is measured using a thermometer 26. The electrolyte 32 is constantly recirculated between the constant temperature reservoir 28 and the cell 25 using positive displacement pump 31. The electrolyte overflows by gravity back into the constant temperature reservoir 28 through conduit 33.

The temperature of the solution in the constant temperature reservoir 28 is measured using a thermometer and is controlled at a desired value with ∼±1°C by a Thermo-O-Watch temperature regulator 30 actuating the quartz immersion heater 29. Since in preferred cases the operating temperature is usually above room temperature, no cooling means for the solution is shown.

The electrolytic cell 25 is constructed of lucite (plexiglass), which readily withstands the action of such electrolyte solutions as dilute oxalic acid at the temperatures involved. Because lucite is transparent it is possible, in addition to voltage and current monitoring, to visually observe the progress of anodization.

The anodized part holder 34 is also constructed of lucite. An insulated platinum wire 35 is brought through a channel in the lucite anode holder. The wire makes contacts with the surface of the part 36 being anodized, around the perimeter of the part.

The cathode 37 consists of a large area platinum sheet. Since the surface area of the cathode is large in comparison with the surface area being anodized the cathode current density is small. In addition since electrolyte resistance is very small the recorded cell voltage is equal within 0.025 to 0.5% to the potential (voltage) of the anode. Since the anode is connected to a highly positive potential, any nonanodizable metallic part of the electrode holder at the same potential as the anode could either dissolve or give rise to vigorous $O_2$ evolution. Under steady state condition of anodization such as when using 8% oxalic acid anodization, at about 22° C and a potential of 25V to proceed at a suitable (3.5 ma/cm$^2$) current density, exposed nonanodizable metal or a noble metal would be a site of extensive corrosion and/or oxygen evolution. Under such conditions even a small exposed area is capable of drawing a significant current thereby influencing the total current reading and the local current density. For this reason the whole electrode holder 34 was made of plexiglass, with a Pt wire 35, embedded in epoxy glue, making contact with the surface of the anodizable part 36.

The following nonlimiting examples are provided to further illustrate the present invention.

EXAMPLE 1

A 400 A thick layer of niobium is sputtered onto a glass substrate of about 10 mils thickness. A 3 micron thick layer of aluminum is then deposited on top of the niobium film at about room temperature. The aluminum is preanodized in an 8% boric acid solution at room temperature employing a current of 3.5 milliamperes per cm$^2$ of aluminum surface area for about 1¾ minutes. Next the article is removed from the boric acid solution and is exposed to a 1% oxygen in $CF_4$ plasma at about 50 watt power input at room temperature for about 5 minutes. After this, the article is baked at about 150° C for about 1 hour in air. Next Shipley Resist 1350 is applied to the aluminum layer. The article is then baked at about 75° C for about ½ hour. After this, the article is exposed to the desired line pattern and developed by ultraviolet light. The article is then baked at about 110° C for about 20 minutes and is next exposed to 1% oxygen in $CF_4$ plasma at about 50 watt power input at room temperature for about 5 minutes to remove organic residue after development.

The aluminum is anodized in an 8% boric acid solution employing a current of 3.5 milliamperes per cm$^2$ of surface area of aluminum at 25° C for about 67 minutes. The voltage is measured to be about 17 volts. After this a constant potential of about 35–40 volts at room temperature is applied for about 10 to 15 minutes to anodize the aluminum residue. During this time the current density drops to about 1.5 ma/cm$^2$. Following this a constant current of about 1.85 ma/cm$^2$ is applied to anodize the niobium to completion. During this time, the potential rises to 150 volts within 7 minutes.

The light transmission of the article is measured and found in the wavelength region 4000–8000 A to be 80%. In comparison, the anodizing process is repeated except that no niobium underlayer is employed. The light transmission of that article is found to be only 50%.

Moreover, the use of the niobium underlayer made it possible to anodize about 4 micron wide lines of aluminum on 8 micron centers as compared to patterns of only 1.5 microns without using the niobium layer.

The anodized sample prepared according to the present invention is subsequently treated in air for several hours at 300° to 350° C. This treating improves the light transmission and increases the resistance between two adjacent lines.

EXAMPLE 2

A 200 A thick layer of niobium is sputtered onto a glass substrate of about 10 mils thick. A 5.0 micron thick layer of aluminum is then deposited on top of the niobium layer. The aluminum is anodized in an 8% oxalic acid solution employing a current density of 3.5 milliamperes/cm$^2$ of surface area of aluminum at 40° C for about 68 minutes. During this time the potential remains at 7 volts. Next a constant potential of about 9 volts at room temperature is applied for about 20 minutes. After this the voltage is adjusted to 30 volts at 40° C. The niobium film takes about 1 minute to be completely anodized. The results obtained are similar to those obtained above in Example 1.

EXAMPLE 3

A 400 A thick layer of titanium is sputtered onto a glass substrate of about 10 mils thickness. A 4 micron thick layer of aluminum is then deposited on top of the titanium film at about room temperature. The aluminum is preanodized in an 8% boric acid solution at room temperature employing a current of 3.5 milliamperes per cm$^2$ of aluminum surface area for 1¾ minutes. Next the article is removed from the boric acid solution and is exposed to a 1% oxygen in $CF_4$ plasma at about 50 volt power input at room temperature for about 5 minutes. After this the article is baked at about 150° C for about 1 hour in air. Next Shipley Resist 1350 is applied to the aluminum layer. The article is then baked at about 75° C for about ½ hour. After this, the article is exposed to the desired line pattern and developed by ultraviolet light. The article is then baked at about 110° C for about 20 minutes and is next exposed to 1% oxygen in $CF_4$ plasma at about 50 watt power input at room temperature for about 5 minutes to remove organic residue after development.

The aluminum is anodized in an 8% oxalic acid solution employing a current of 3.5 milliamperes per cm$^2$ of surface area of aluminum at 25° C for about 93 minutes. The voltage is measured to be about 16 volts. After this a constant potential of about 35–40 volts at room temperature is applied for about 5–10 minutes to anodize the aluminum residue. Following this a constant current of about 1.85 ma/cm$^2$ is applied to anodize the titanium to completion. This current is kept low enough to prevent gas formation of the Ti glass substrate interface and to avoid formation of blisters due to weakened Ti/substrate adhesion. During this time, the potential rises 150 volts within 7 minutes.

The light transmission of the article is measured and found to be about 60% at a wavelength of 4000 A and 80% at 8000 A. The anodized sample prepared according to the present invention is subsequently treated in air for several hours at 300° to 350° C. This treating improves the light transmission and increases the resistance between adjacent lines. When employing titanium as the underlayer, it has occasionally been observed that the anodized titanium films are somewhat coarser than other anodized films such as the niobium layers. These titanium layers occasionally demonstrate striped rings which appear when the potential increases at the end of a run and gas is suddenly produced. It is possible to avoid the formation of these rings by reducing the current density by one order of magnitude during the period of sharp potential increase.

EXAMPLE 4

An 800 A thick layer of tantalum is sputtered onto a glass substrate of about 10 mils thick. A 3.5 micron thick layer of aluminum is then deposited on top of the tantalum layer. The aluminum is anodized in an 8% boric acid solution employing a current density of 3.5 milliamperes/cm² of surface area of aluminum at 40° C for about 47 minutes. The potential is recorded to be 8 volts. Next a constant potential of about 18 volts at 40° C is applied for about 12 minutes. After this a constant current density of about 3.5 milliamperes/cm² of surface area of tantalum at 40° C is applied until the potential reaches 150 volts which takes about 14 minutes to oxidize the tantalum layer. The results obtained are similar to those obtained above in Example 1.

EXAMPLE 5

An 800 A thick layer of tantalum is sputtered onto a glass substrate of about 10 mils thick. A 3.5 micron thick layer of aluminum is then deposited on top of the tantalum layer. The aluminum is then deposited on top of the tantalum layer. The aluminum is anodized in an 8% oxalic acid solution employing a current of 7.0 milliamperes/cm² of aluminum surface area at 30° C for about 65 minutes. The potential during this constant current anodizing phase remains at about 23 volts. Next a constant potential of about 40 volts at 30° C is applied for about 10 minutes. After this a constant current density of about 3.5 milliamperes/cm² of surface area of tantalum at 30° C is applied until the potential reaches 150 volts which takes about 7 minutes to oxidize the tantalum layer. The results obtained are similar to those obtained above in Example 1.

EXAMPLE 6

An 800 A thick layer of tantalum is sputtered onto a glass substrate of about 10 mils thick. A 3.5 micron thick layer of aluminum is then deposited on top of the layer. The aluminum is anodized in an 8% oxalic acid solution employing a current density of 3.5 milliamperes/cm² of surface area of aluminum at 30° C for about 60 minutes. Next a constant potential of about 40 volts at 30° C temperature is applied for about 10 minutes. After this a constant current of about 3.5 milliamperes/cm² of surface area of tantalum at 30° C temperature is applied until the potential reaches 150 volts which takes about 5 minutes to oxidize the tantalum layer. The results obtained are similar to those obtained above in Example 1.

EXAMPLE 7

A 500 A thick layer of magnesium is sputtered onto a glass substrate of about 10 mils thick. A 4 micron thick layer of aluminum is then deposited on top of the magnesium employing a current density of 3.5 milliamperes/cm² of surface area of aluminum at 25° C temperature for about 93 minutes, during which time a potential of 17V. is recorded. Next a constant potential of about 35 volts at room temperature is applied for about 10 minutes to remove aluminum residue. After this a constant current density of about 2 milliamperes/cm² of surface area of magnesium at room temperature is applied until the potential reaches 150 volts which takes about 10 minutes to oxidize the magnesium layer. The results obtained are similar to those obtained above in Example 1.

EXAMPLE 8

A 300 A thick layer of amorphous silicon is evaporated onto a glass substrate of about 10 mils thick. A 3 micron thick layer of aluminum is then deposited at room temperature on top of the amorphous silicon layer. The aluminum is anodized in an 8% oxalic acid solution employing a current density of 3.5 milliamperes/cm² of surface area of aluminum at 40° C for about 48 minutes. Next a constant potential of about 40 volts at 40° C is applied for about 10 minutes. After this a constant, current density of about 2 milliamperes/cm² of surface area amorphous silicon at 40° C is applied until the potential reaches 150 volts which takes about 5 minutes to oxidize the amorphous silicon layer. The results obtained are similar to those obtained above in Example 1.

EXAMPLE 9

A 400 A thick layer of niobium is sputtered onto a glass substrate of about 10 mil thickness. A three micron thick layer of Al-Cu alloy containing about 2% Cu is then deposited on top of the niobium at room temperature. The Al-Cu alloy is preanodized in an 8% boric acid solution at room temperature employing a current of 3.5 milliamperes per cm² of alloy surface area for about 1¾ minutes. Next the article is removed from the boric acid solution and is exposed to a 1% oxygen in $CF_4$ plasma at about 50 watt power input at room temperature for about 5 minutes. After this, the article is baked at about 150° C for about 1 hour in air. Next Shipley Resist 1350 is applied to the Al-Cu layer. The article is then baked at about 75° C for about ½ hour. After this, the article is exposed to the desired line pattern and developed by ultraviolet light. The article is then baked at about 110° C for about 20 minutes and is next exposed to 1% oxygen in $CF_4$ plasma at about 50 watt power input at room temperature for about 5 minutes to remove organic residue after development. The aluminum copper alloy is then anodized in an 8% oxalic acid solution employing a current of 3.5 milliamperes per cm² of alloy surface area at 25° C temperature for about 85 minutes. The voltage is measured to be between 8 and 10 volts. Oxygen evolution is observed during the anodization. After this a potential is increased to a constant value ranging between 25 and 35 volts at room temperature. This voltage is applied for about 10–15 minutes to oxidize the Al residue. During this time the current drops to about 1.5 ma/cm². Following this a constant current of about 1.85 ma/cm² of surface area of niobium is applied to anodize Nb to completion. During this time the potential rises to 150V within about 7 minutes. The resist is removed using acetone. The sample is subsequently heated for several hours at about 300°–350° C in air. This increases the resistance between adjacent lines.

Moreover, patterns obtained by the above examples possess improved line resolution and minimum undercut of the patterns. Advantageous results have been obtained by practice of the present invention employing from about 200 A to 1500 A thick layers of the conductive material with about 2–5 micron thick layers of aluminum.

What is claimed is:

1. A process for forming anodized porous metal material containing articles which comprises:
    A. depositing an electrically conductive layer on a dielectric layer;
    B. depositing a porous metal oxide-forming layer on the electrically conductive layer, the porous metal oxide-forming layer being thicker than the electrically conductive layer;
    C. anodizing at least a portion of the porous metal oxide-forming layer through the complete thickness of the layer to provide a layer containing porous anodized material;
    D. the electrically conductive layer deposited in step (A) constituting a material different from the material deposited in step (B) and having a higher conductivity than said substrate, and the conditions of anodization being such that the material deposited in step (A) acts as a valve metal during the anodizing of the porous metal oxide-forming layer and thickness of said conductive layer being such that it requires a higher potential for its anodization than is required for anodization of the porous metal oxide-forming metallic layer; and then
    E. treating said electrically conductive layer to render it nonconductive.

2. The process of claim 1 wherein said dielectric is silicon dioxide or glass.

3. The process of claim 1 wherein said electrically conductive layer contains material selected from the group consisting of Group IIA metals, Group IVA materials, Group VB substances, and Group VIB metals.

4. The process of claim 1 wherein the electrically conductive layer contains a member selected from the group consisting of niobium, tantalum, and hafnium.

5. The process of claim 1 wherein the porous metal oxide-forming layer is at least about 5 times as thick as the electrically conductive layer.

6. The process of claim 1 wherein said porous metal oxide-forming layer is between about 50 and 250 times as thick as said electrically conductive layer.

7. The process of claim 1 wherein said metal oxide-forming layer contains aluminum.

8. The process of claim 1 wherein said metal oxide-forming layer is an aluminum-copper alloy containing at least about 95% by weight of aluminum.

9. An article obtained by the process of claim 1.

10. A process for forming anodized porous metal material containing articles which comprises:
    A. depositing an electrically conductive layer on a dielectric layer;
    B. depositing a porous metal oxide-forming layer on the electrically conductive layer, the porous metal oxide-forming layer being thicker than the electrically conductive layer;
    C. anodizing at least a portion of the porous metal oxide-forming layer through the complete thickness of the layer to provide a layer containing porous anodized material;
    D. the electrically conductive layer deposited in step (A) constituting a material different from the material deposited in step (B) and having a higher conductivity than said substrate, and the conditions of anodization being such that the material deposited in step (A) acts as a valve metal during the anodizing of the porous metal oxide-forming layer and thickness of said conductive layer being such that it requires a higher potential for its anodization than is required for anodization of the porous metal oxide-forming metallic layer; and then
    E. oxidizing said electrically conductive layer.

11. The process of claim 10 wherein oxidizing of the electrically conductive layer includes at least one of the steps of:
    A. anodization;
    B. oxidation at elevated temperature in oxygen-containing atmosphere; and
    C. oxidation due to the presence of a substance which can readily give up oxygen at elevated temperature.

12. The process of claim 10 which comprises oxidizing said electrically conductive layer in the same anodizing solution as used to anodize the porous metal oxide-forming layer in step (C) but using a higher potential than used in step (C).

13. The process of claim 10 wherein said electrically conductive layer is selected from the group consisting of niobium, tantalum, and hafnium; said porous metal oxide-forming layer contains aluminum, and said porous metal oxide-forming layer is between about 50 and 250 times as thick as said electrically conductive layer, and which comprises oxidizing said electrically conductive layer in the same anodizing solution as employed in step (C) but using a higher potential than employed in step (C).

14. The process of claim 10 which includes anodizing the electrically conductive layer.

15. The process of claim 10 which includes anodizing the electrically conductive layer and then heating the article to temperature sufficient to cause release of water which may be present in the anodized layers as free water, water of hydration or metal hydroxides.

16. The process of claim 15 which comprises heating the article to about 300° to about 350° C in air.

17. The process of claim 10 wherein said dielectric is silicon dioxide or glass.

18. The process of claim 10 wherein the electrically conductive layer contains a member selected from the group consisting of niobium, tantalum, and hafnium.

19. The process of claim 10 wherein said metal oxide-forming layer contains aluminum.

20. The process of claim 10 wherein said metal oxide-forming layer is an aluminum-copper alloy containing at least about 95% by weight of aluminum.

21. A process for forming a multilevel metallurgical integrated structure which comprises:
    A. depositing an electrically conductive layer on a dielectric layer;
    B. depositing a porous metal oxide-forming layer on the electrically conductive layer, wherein the porous metal oxide-forming layer is thicker than the electrically conductive layer;

C. anodizing only a portion of the porous metal oxide-forming layer through the complete thickness of the layer to provide a layer containing porous material while protecting from anodization preselected portions of the porous metal oxide-forming layer which are to form desired electrical connections;

D. the electrically conductive layer deposited in step (A) constituting a material different from the material deposited in step (B), and having a higher conductivity than said substrate, and the conditions of anodization being such that the material deposited in step (A) acts as a valve metal during the anodizing of the porous metal oxide-forming layer and requires a higher potential for its anodization than is required for anodization of the porous metal oxide-forming metallic layer;

E. then treating the electrically conductive layer to render it nonconductive;

F. depositing a dielectric or semiconductive layer on the layer containing the anodized porous metal oxide and the desired electrical connections; and G. then repeating steps (A) to (E).

22. The process of claim 21 wherein the dielectric layer is silicon containing a multiplicity of semiconductive devices.

23. The process of claim 21 wherein said electrically conductive layers contain material selected from the group consisting of Group IIA metals, Group IVA materials, Group VB substances, and Group VIB metals.

24. The process of claim 21 wherein the electrically conductive layer contains a member selected from the group consisting of niobium, tantalum, and hafnium.

25. The process of claim 21 wherein the porous metal oxide-forming layers are at least about 5 times as thick as the electrically conductive layers.

26. The process of claim 21 wherein said porous metal oxide-forming layers are between about 50 and 250 times as thick as said electrically conductive layers.

27. The process of claim 21 wherein said metal oxide-forming layers contain aluminum.

28. The process of claim 21 wherein said metal oxide-forming layers are aluminum-copper alloy containing at least about 95% by weight of aluminum.

29. The process of claim 21 which comprises coating said preselected portions of the porous metal oxide-forming layer with a photoresist or electron sensitive resist polymer composition to protect said preselected portions from anodization.

30. The process of claim 29 which comprises preoxidizing the porous oxide-forming layer to a thickness of approximately the buildup of barrier layer of oxide and just at about the beginning of the formation of porous oxide, and thereafter coating said preselected portions with said photoresist polymer composition.

31. The process of claim 29 which comprises preoxidizing the porous metal oxide-forming layer to a depth of about 500° to 1200° A, then exposing the preoxidized layer to 1% oxygen in $CF_4$ plasma at about 50 watt power input at room temperature for about 5 minutes, then heating at about 150° C for about 1 hour in air, next coating said preselected portions with said photoresist or electron sensitive resist polymer composition, then heating at about 75° C for about ½ hour, next exposing to the desired pattern followed by developing; next heating at about 110° C for about 20 minutes and then exposing to 1% oxygen in $CF_4$ plasma at about 50 watt power input at room temperature for about 5 minutes to remove organic residue after development.

32. A multilevel metallurgical integrated structure obtained by the process of claim 21.

33. A process for forming a multilevel metallurgical integrated structure which comprises:

A. depositing an electrically conductive layer on a dielectric layer;

B. depositing a porous metal oxide-forming layer on the electrically conductive layer; wherein the porous metal oxide-forming layer is thicker than the electrically conductive layer;

C. anodizing only a portion of the porous metal oxide-forming layer through the complete thickness of the layer to provide a layer containing porous material while protecting from anodization preselected portions of the porous metal oxide-forming layer which are to form desired electrical connections;

D. the electrically conductive layer deposited in step (A) constituting a material different from the material deposited in step (B), and having a higher conductivity than said substrate, and the conditions of anodization being such that the material deposited in step (A) acts as a valve metal during the anodizing of the porous metal oxide-forming layer and requires a higher potential for its anodization than is required for anodization of the porous metal oxide-forming metallic layer;

E. then oxidizing the electrically conductive layer;

F. depositing a dielectric or semiconductive layer on the layer containing the anodized porous metal oxide and the desired electrical connections; and G. then repeating steps (A) to (E).

34. The process of claim 33 wherein oxidizing of the electrically conductive layer includes at least one of the steps of:

A. anodization;

B. oxidation at elevated temperature in oxygen-containing atmosphere; and

C. oxidation due to the presence of a substance which can readily give up oxygen.

35. The process of claim 33 wherein said electrically conductive layer contains a member selected from the group consisting of niobium, tantalum, and hafnium.

36. The process of claim 33 wherein said first metal oxide-forming layers contain aluminum.

37. The process of claim 33 wherein said metal oxide-forming layer is an aluminum-copper alloy containing at least about 95% by weight of aluminum.

38. The process of claim 33 which comprises treating said electrically conductive layer in the same anodizing solution as used to anodize the porous metal oxide-forming layer in step (C) but employing a higher potential than used in step (C).

39. The process of claim 33 wherein said electrically conductive layers are selected from the group consisting of niobium, titanium, tantalum, hafnium, amorphous silicon, polycrystalline silicon and magnesium; said porous metal oxide-forming layers are aluminum, and said porous metal oxide-forming layers are between about 50 and 250 times as thick as said electrically conductive layers and treating said electrically conductive layers in the same anodizing solution as employed in step (C) but employing a higher potential than used in step (C).

40. The process of claim 21 wherein the temperature of the anodization of step (C) is selected to render the height of the porous metal oxide more level with that of the unanodized metal.

41. The process of claim 33 which includes anodizing the electrically conductive layer.

42. The process of claim 33 which includes anodizing the electrically conductive layer and then heating the article to temperature sufficient to cause release of water which may be present in the anodized layers as free water, water of hydration or metal hydroxides.

43. The process of claim 42 which comprises heating the article to about 300° to about 350° C in air.

44. An anodized porous metal oxide-containing article which comprises:
  A. a dielectric layer;
  B. an anodized porous metal material containing layer on said dielectric layer;
  C. a nonelectrically conductive layer obtained from a conductive layer interposed between the anodized porous metal oxide-containing layer and the dielectric layer; and
  D. the anodized porous metal material containing layer being thicker than the nonelectrically conductive layer and being different material than said nonelectrically conductive layer.

45. A multilevel metallurgical integrated structure which comprises:
  A. a first dielectric layer;
  B. a first anodized porous material containing layer on the dielectric layer;
  C. a first nonelectrically conductive layer obtained from an electrically conductive layer interposed between the anodized porous metal oxide-containing layer and the dielectric layer;
  D. the anodized porous metal oxide-containing layer being thicker than the nonelectrically conductive layer and being different material than said nonelectrically conductive layer;
  E. the anodized porous metal material containing layer also including unanodized metal portions which form predetermined electrical connections;
  F. elements (A)–(E) cooperating with one another to form one level of the multilevel metallurgical integrated structure; and
  G. at least one further level containing the same arrangement of elements described in (A)–(E), with the dielectric layer of the further level being superimposed on the anodized porous metal material containing layer of the one level.

46. The process of claim 33 which comprises treating said electrically conductive layer in an anodizing solution different than that used to anodize the porous metal oxide-forming layer in step (C).

* * * * *

UNITED STATES PATENT AND TRADEMARK OFFICE
CERTIFICATE OF CORRECTION

PATENT NO. : 3,971,710
DATED : July 27, 1976
INVENTOR(S) : Lubomyr T. Romankiw

It is certified that error appears in the above-identified patent and that said Letters Patent are hereby corrected as shown below:

In the Heading, please correct the name of the assignee to:
-- International Business Machines Corporation (IBM), Armonk, New York --

Column 1, line 12, change "a" to -- as --.

Column 1, line 47, change "If" to -- if --.

Column 4, line 27, change "anoidize" to -- anodize --.

Column 4, line 68, change "metal" to -- metals --.

Column 6, line 65, change "underlay" to -- underlayer --.

Column 7, line 29, change "contains" to -- contain --.

Column 8, line 18, change "anozided" to -- anodized --.

Column 8, line 47, change "met-" to -- materials --.

Column 8, line 48, delete "als".

UNITED STATES PATENT OFFICE
CERTIFICATE OF CORRECTION

PATENT NO. : 3,971,710
DATED : July 27, 1976
INVENTOR(S) : Lubomyr. T. Romankiw

It is certified that error appears in the above-identified patent and that said Letters Patent are hereby corrected as shown below:

Column 10, line 61, after "above" insert -- whereafter the masking means employed can be removed or destroyed when desired by any of the associated procedures previously discussed above --.

Column 13, line 19, after "within" insert -- ∿ --.

Signed and Sealed this

First Day of February 1977

[SEAL]

Attest:

RUTH C. MASON
Attesting Officer

C. MARSHALL DANN
Commissioner of Patents and Trademarks